(12) United States Patent
Lee

(10) Patent No.: US 9,484,079 B2
(45) Date of Patent: Nov. 1, 2016

(54) MEMORY DEVICE AND MEMORY SYSTEM INCLUDING THE SAME

(71) Applicant: SK hynix Inc., Gyeonggi-do (KR)

(72) Inventor: Yo-Sep Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/732,354

(22) Filed: Jun. 5, 2015

(65) Prior Publication Data

US 2016/0225435 A1  Aug. 4, 2016

(30) Foreign Application Priority Data

Feb. 2, 2015  (KR) .......................... 10-2015-0015952

(51) Int. Cl.
*G11C 11/406*  (2006.01)

(52) U.S. Cl.
CPC ................................ *G11C 11/40626* (2013.01)

(58) Field of Classification Search
None
See application file for complete search history.

(56) References Cited

U.S. PATENT DOCUMENTS

| | | | |
|---|---|---|---|
| 8,300,488 B2 | 10/2012 | Pyeon | |
| 2003/0218931 A1 | 11/2003 | Okamoto et al. | |
| 2006/0245288 A1* | 11/2006 | Hokenmaier | G11C 11/406 365/222 |

* cited by examiner

*Primary Examiner* — James G Norman
(74) *Attorney, Agent, or Firm* — IP & T Group LLP

(57) ABSTRACT

A memory device may include a temperature sensor suitable for generating temperature information and a smart refresh circuit suitable for activating a smart refresh signal when an internal refresh signal is activated a set number of times, and controlling the set number based on the temperature information.

15 Claims, 6 Drawing Sheets

MEMORY DEVICE AND MEMORY SYSTEM INCLUDING THE SAME

CROSS-REFERENCE TO RELATED APPLICATIONS

The present application claims priority of Korean Patent Application No. 10-2015-0015952, filed on Feb. 2, 2015, which is incorporated herein by reference in its entirety.

BACKGROUND

1. Field

Exemplary embodiments of the present invention relate to a memory device and, more particularly, to a refresh operation of a memory device.

2. Description of the Related Art

A memory cell of a memory device includes a transistor configured to serve as a switch and a capacitor configured to store charges (or data). A level of data is determined as "high" (logic 1) or "low" (logic 0) depending on whether there is a charge in the capacitor of the memory cell, that is, whether the voltage potential between both terminals of the capacitor is high or low. In theory, there is no consumption of power because the charge should remain in the capacitor. However, data may be lost as the charge stored in the capacitor is lost due to leakage. This leakage is attributable to the PN junction of the MOS transistor. In order to prevent such loss, it is necessary to read data stored in the memory cell, and recharge the memory cell based on the read data, before the data is lost. The only way to retain the data is by repeating the recharging periodically. This process of recharging the memory cell capacitors is called a refresh operation.

The amount of charge leakage increases as temperature increases and decreases as temperature decreases. That is, the data retention time of the memory cells is reduced as temperature increases and increases as temperature decreases. Accordingly, there are techniques for controlling the period for how often refresh operations are executed depending on temperature, as refresh operations need to be performed more frequently when the temperature is high and less frequently when the temperature is low.

As the degree of integration of memory devices is increased, the interval between word lines is reduced. As the interval between word lines is reduced, the coupling effect between adjacent word lines increases.

A word line toggles between an active state and an inactive state whenever data is input to and output from a memory cell. This induces a coupling effect in adjacent word lines. This may affect the charge of memory cells that are connected to adjacent word lines, resulting in a loss of data. This phenomenon is called a row hammering phenomenon. Due to the row hammering phenomenon, data stored in a memory cell may be lost or altered before the memory cell is refreshed.

FIG. 1 is a diagram illustrating a row hammering phenomenon and illustrating part of a cell array included in a memory.

In FIG. 1, 'WLK' corresponds to a frequently activated word line, and 'WLK−1' and 'WLK+1' correspond to word lines disposed adjacent to the frequently activated word line WLK. Furthermore, 'CELL_K' is a memory cell connected to the frequently activated word line WLK, 'CELL_K−1' is a memory cell connected to an adjacent word line WLK−1, and 'CELL_K+1' is a memory cell connected to an adjacent word line WLK+1. The memory cells CELL_K, CELL_K−1, and CELL_K+1 include cell transistors TR_K, TR_K−1, and TR_K+1 and cell capacitors CAP_K, CAP_K−1, and CAP_K+1. For reference, 'BL' and 'BLB' indicate bit lines.

In FIG. 1, when the frequently activated word line WLK is activated or deactivated, the voltages of the adjacent word line WLK−1 and the adjacent word line WLK+1 rise or drop due to a coupling phenomenon between the frequently activated word line WLK and the adjacent word line WLK−1 and between the frequently activated word line WLK and the adjacent word line WLK+1, thus affecting the amount of charge stored in the memory cells CELL_K−1 and CELL+K+1. When the frequently activated word line WLK toggles between an active state and an inactive state, the amount of charge stored in the cell capacitors CAP_K−1 and CAP_K+1 of the memory cells CELL_K−1 and CELL_K+1 may increase, and data stored in the memory cells may be lost.

Further explaining the coupling effect, electrons are pushed into or drained from the capacitors of memory cells of adjacent word lines or due to electromagnetic waves generated when a word line is toggled between an active state and an inactive state.

The method chiefly used to improve the row hammering phenomenon in which data stored in memory cells CELL_K−1 and CELL_K+1 connected to adjacent word lines WLK+1 and WLK−1 is deteriorated due to the frequently activated word line WLK, is to additionally refresh the adjacent word lines WLK+1 and WLK−1 in addition to a normal refresh operation. Such a refresh operation is called a smart refresh operation. In general, the smart refresh operation is executed whenever a set number of normal refresh operations are executed. For example, whenever four normal refresh operations are executed, the smart refresh operation may be executed once.

The data retention time of a memory cell is influenced by temperature, whereas a phenomenon in which data is drained due to the row hammering phenomenon is not related to temperature. Accordingly, there is a need for a technology in which a period of the normal refresh operation is controlled by temperature and the period of the smart refresh operation is controlled regardless of temperature.

SUMMARY

Various embodiments are directed to a memory device and a memory system capable of controlling a period of a normal refresh operation in response to temperature and a period of a smart refresh operation regardless of temperature.

In an embodiment, a memory device may include a temperature sensor suitable for generating temperature information and a smart refresh circuit suitable for activating a smart refresh signal when an internal refresh signal is activated a set number of times, and controlling the set number based on the temperature information.

The smart refresh circuit may increase the set number when the temperature information indicates a higher temperature and may decrease the set number when the temperature information indicates a lower temperature.

The smart refresh signal may include a signal that enables a smart refresh operation for refreshing memory cells coupled to word lines adjacent to a frequently activated word line.

The smart refresh circuit may control the set number based on the temperature information when an activation of the internal refresh signal is controlled based on the temperature information, and control the set number regardless of the temperature information when the activation of the internal refresh signal is controlled regardless of the temperature information.

In an embodiment, a memory device may include a temperature sensor suitable for generating temperature information, a normal refresh circuit suitable for generating an internal refresh signal in response to a refresh command while selectively receiving the refresh command at a specific ratio based on the temperature information when an internal temperature control refresh mode is set, and a smart refresh circuit suitable for activating a smart refresh signal when the internal refresh signal is activated a set number of times, and controlling the set number based on the temperature information when any of the internal temperature control refresh mode and an external temperature control refresh mode is set.

The normal refresh circuit may increase the specific ratio when the temperature information indicates a higher temperature and decrease the specific ratio when the temperature information indicates a lower temperature. The smart refresh circuit may increase the set number when the temperature information indicates a higher temperature, and decrease the set number when the temperature information indicates a lower temperature.

In an embodiment, a memory system may include a memory controller and a memory device. The memory controller may apply a refresh command to the memory device. The memory device may include a temperature sensor suitable for generating temperature information, a normal refresh circuit suitable for activating an internal refresh signal for executing a normal refresh operation when the refresh command is applied, while selectively receiving the refresh command at a specific ratio based on the temperature information, and a smart refresh circuit suitable for activating a smart refresh signal for executing a smart refresh operation when the internal refresh signal is applied a set number of times.

The smart refresh circuit may activate the smart refresh signal when the internal refresh signal is activated the set number of times, but may control the set number based on the temperature information.

In an embodiment, a memory system may include a memory controller and a memory device. The memory controller may control the period in which a refresh command is applied to the memory device in response to temperature information received from the memory device. The memory device may include a temperature sensor suitable for generating the temperature information, a transmission unit suitable for transferring the temperature information to the memory controller, a normal refresh circuit suitable for activating an internal refresh signal for executing a normal refresh operation whenever the refresh command is applied, and a smart refresh circuit suitable for activating a smart refresh signal for executing a smart refresh operation when the internal refresh signal is applied a set number of times, and controlling the set number based on the temperature information.

DETAILED DESCRIPTION

Figure 1:
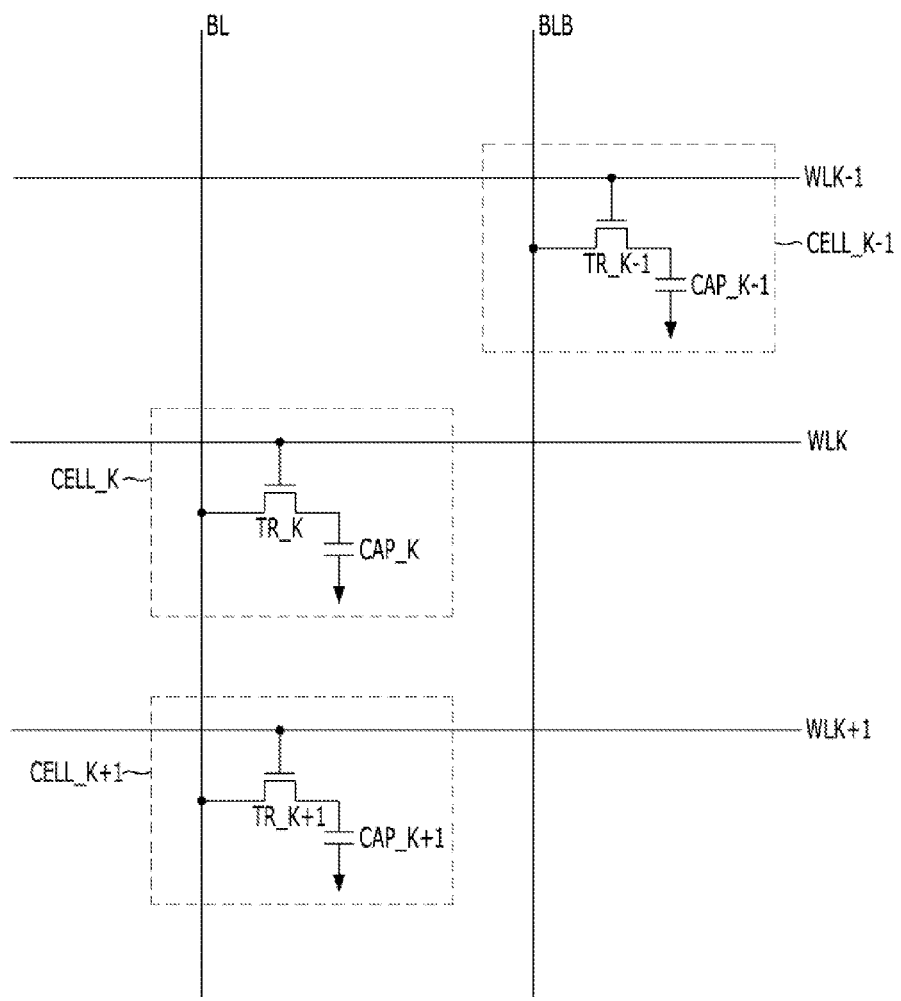
FIG. 1 is a diagram illustrating a row hammering phenomenon and illustrating a part of a cell array included in a memory.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
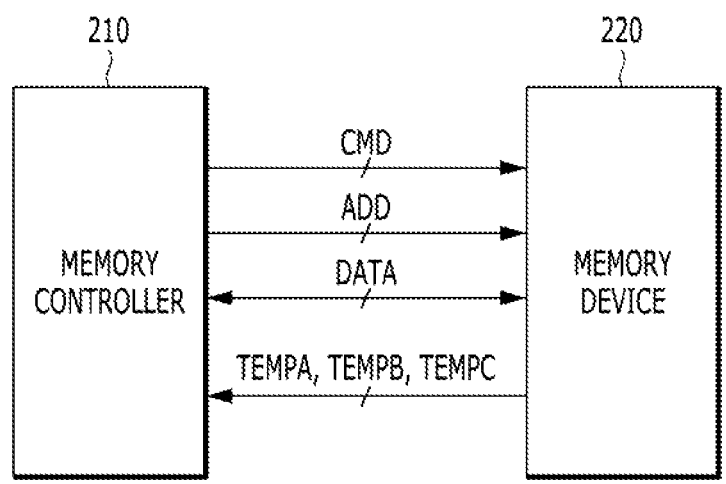
FIG. 2 is a block diagram illustrating a memory system in accordance with an embodiment of the present invention.

FIG. 2 is a diagram illustrating a memory system in accordance with an embodiment of the present invention.

Referring to FIG. 2, the memory system may include a memory controller 210 and a memory device 220.

The memory controller 210 may control an operation of the memory device 220. A command CMD applied from the memory controller 210 to the memory device 220 may indicate an operation to be performed by the memory device 220. For example, the memory controller 210 may instruct the memory device 220 to perform an active, precharge, read, write, refresh, and setting operation in response to the command CMD. The command CMD may include a plurality of signals. The signals may include a chip selection signal CS, an active signal ACT, a row address strobe signal RAS, a column address strobe signal CAS, and a write enable signal WE. An address ADD applied from the memory controller 210 to the memory device 220 may designate a region to be accessed within the memory device 220, that is, a region on which a read or write operation is performed. When the write operation is performed, the memory controller 210 may output data DATA to be written to the memory device 220. When the read operation is performed, the memory controller 210 may receive data DATA read from the memory device 220.

The memory controller 210 may periodically apply a refresh command that instructs the memory device 220 to execute a normal refresh operation in response to the command CMD. For controlling a period in which the normal refresh operation is executed depending on a temperature, the memory device 220 may use first and second methods. In the first method, the memory device 220 may control the period in which the normal refresh operation is executed under the control of the memory controller 210 (Hereinafter, it is referred as an external temperature control refresh mode). In the second method, the memory device 220 may control the period in which the normal refresh operation is executed by itself. (Hereinafter, this is referred to as an internal temperature control refresh mode).

In the external temperature control refresh mode, temperature information TEMPA, TEMPB, and TEMPC conveying the temperature of the memory device 220 may be transmitted from the memory device 220 to the memory controller 210. Accordingly, the memory controller 210 may control a period in which a refresh command is applied to the memory device 220 based on the received temperature information TEMPA, TEMPB, and TEMPC. When the temperature of the memory device 220 is higher, the memory controller 210 may more frequently apply the refresh command to the memory device 220 with a first period because the data retention time of the memory device 220 is shortened. Furthermore, when the temperature of the memory device 220 is lower, the memory controller 210 may apply the refresh command to the memory device 220 with a second period which is longer than the first period, because the data retention time of the memory device 220 is lengthened. Accordingly, the memory device 220 may control the period in which the normal refresh operation is executed depending on the temperature.

In the internal temperature control refresh mode, the memory controller 210 may not receive the temperature information TEMPA, TEMPB, and TEMPC from the memory device 220. Accordingly, the memory controller 210 applies the refresh command to the memory device 220 at a regular interval regardless of the temperature. Instead, the period in which the memory device 220 executes the normal refresh operation may be controlled depending on the temperature because the memory device 220 selectively receives the refresh command applied from the memory controller 210 at a specific ratio depending on the temperature.

In the external temperature control refresh mode and the internal temperature control refresh mode, a smart refresh operation executed by the memory device 220 may be performed at a specific interval regardless of the temperature.

Figure 3:
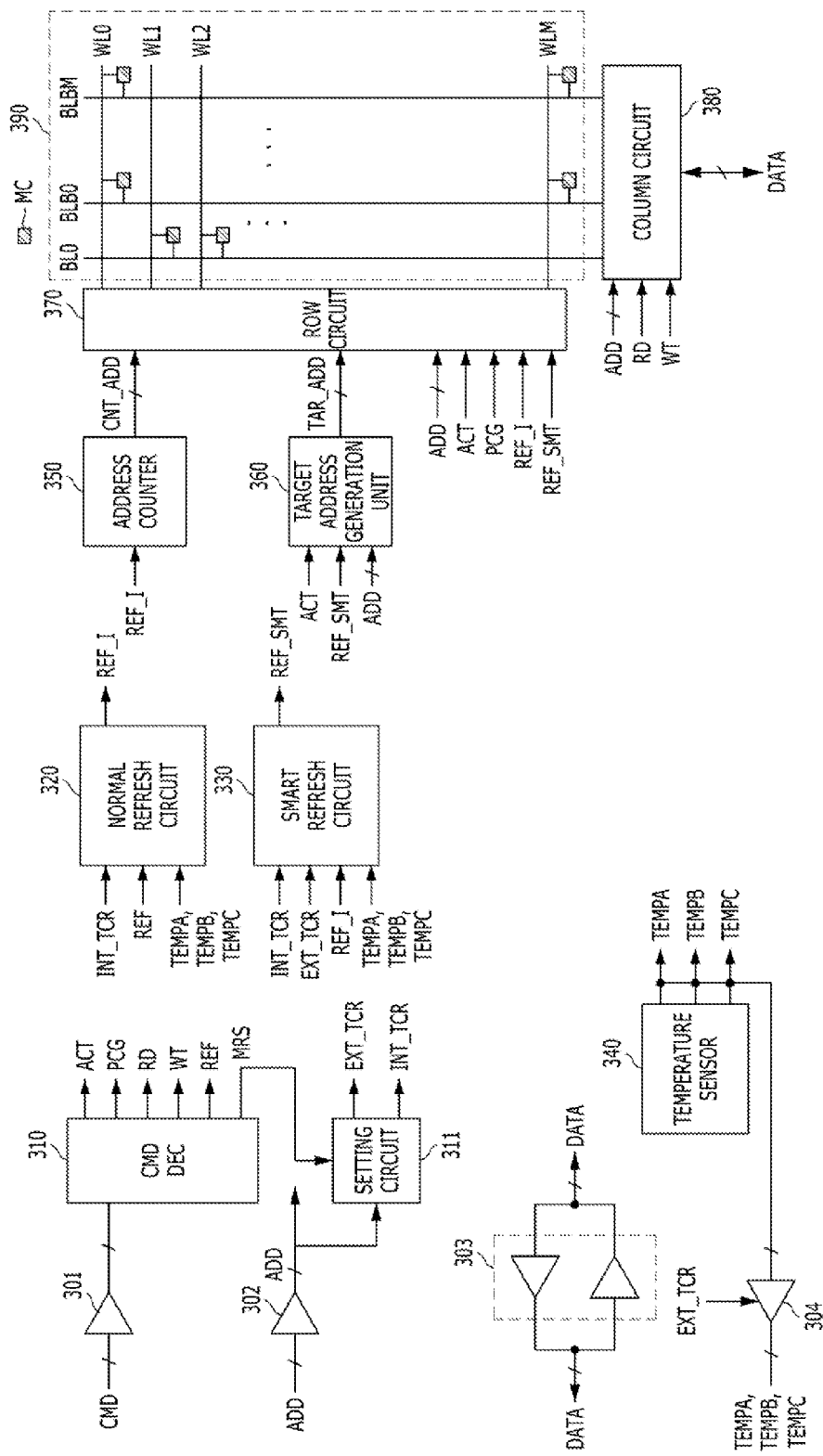
FIG. 3 illustrates a detailed block diagram of a memory device of FIG. 2.

FIG. 3 illustrates a detailed block diagram of the memory device 220 of FIG. 2.

Referring to FIG. 3, the memory device 220 may include a command input unit 301, an address input unit 302, a data input/output unit 303, a temperature information transmission unit 304, a command decoder 310, a setting circuit 311, a normal refresh circuit 320, a smart refresh circuit 330, a temperature sensor 340, an address counter 350, a target address generation unit 360, a row circuit 370, a column circuit 380, and a cell array 390.

The command input unit 301 may receive the command CMD from the memory controller 210. The address input unit 302 may receive the address ADD from the memory controller 210. The data input/output unit 303 may receive data DATA from the memory controller 210 or output data DATA read from the cell array 390 to the memory controller 210. In the external temperature control refresh mode, that is, when an external temperature control refresh mode signal EXT_TCR is activated, the temperature information transmission unit 304 may output the temperature information TEMPA, TEMPB, and TEMPC to the memory controller 210. The command input unit 301, the address input unit 302, the data input/output unit 303, and the temperature information transmission unit 304 may be configured to receive or output a signal of multiple bits because each of the command CMD, the address ADD, the data DATA, and the temperature information TEMPA, TEMPB, and TEMPC include multiple bits. In FIG. 3, elements for outputting the temperature information TEMPA, TEMPB, and TEMPC have been illustrated as being separately configured in the temperature information transmission unit 304. Various modifications, such as the configuration in which the temperature information TEMPA, TEMPB, and TEMPC are transmitted to the memory controller 210 through the data input/output unit 303, may be possible.

The command decoder 310 may generate a variety internal commands ACT, PCG, RD, WT, REF, and MRS by decoding the command CMD received from the command input unit 301. The internal commands may include an active command ACT, a precharge command PCG, a read command RD, a write command WT, a refresh command REF, and a setting command MRS for mode register setting.

When the setting command MRS is activated, the setting circuit 311 may execute a variety of types of setting operations by decoding the address ADD received from the address input unit 302. The setting circuit 311 may activate the external temperature control refresh mode signal EXT_TCR when the external temperature control refresh mode is set, and activate an internal temperature control refresh mode signal INT_TCR when the internal temperature control refresh mode is set. Furthermore, the setting circuit 311 may also execute operations to set various voltage levels and delay values used in the memory device 220. A detailed description of the setting operations is omitted because the setting operations are not directly related to embodiments of the present invention.

The temperature sensor 340 may measure the temperature of the memory device 220 and generate the temperature information TEMPA, TEMPB, and TEMPC. The temperature information TEMPA, TEMPB, and TEMPC may include first to third signals. The third signal TEMPC may be activated at a high temperature, the second signal TEMPB may be activated at room temperature, and the first signal TEMPA may be activated at a low temperature. The temperature information TEMPA, TEMPB, and TEMPC have been shown to include three signals, but the number and formats of signals included in the temperature information may differ depending on design.

The normal refresh circuit 320 may generate an internal refresh signal REF_I in response to the refresh command REF. The internal refresh signal REF_I may enable a normal refresh operation to be executed. When the internal temperature control refresh mode signal INT_TCR is deactivated, the normal refresh circuit 320 may activate the internal refresh signal REF_I whenever the refresh command REF is activated. When the internal temperature control refresh mode signal INT_TCR is activated, the normal refresh circuit 320 may activate the internal refresh signal REF_I by selectively receiving the refresh command REF at a specific ratio depending on the temperature information TEMPA, TEMPB, and TEMPC. The specific ratio in which the normal refresh circuit 320 selectively receives the refresh command REF may be increased as the temperature rises and may be decreased as the temperature drops. For example, at a high temperature, when the third signal TEMPC is activated, the normal refresh circuit 320 may receive the refresh command REF whenever the refresh command REF is applied. At room temperature when the second signal TEMPB is activated, the normal refresh circuit 320 may receive half of the refresh commands REF. That is, the normal refresh circuit 320 may receive the refresh command REF one time when the refresh command REF is applied twice. At low temperature, when the first signal TEMPA is activated, the normal refresh circuit 320 may receive ¼ of the refresh commands REF. That is, the normal refresh circuit 320 may receive the refresh command REF one time when the refresh command REF is applied four times.

The smart refresh circuit 330 may activate a smart refresh signal REF_SMT when the internal refresh signal REF_I is activated a set number of times. The smart refresh signal REF_SMT may be for executing a smart refresh operation for refreshing the memory cells coupled to word lines affected by a row hammering phenomenon, i.e., word lines adjacent to a frequently activated word line. When the internal temperature control refresh mode is set and the internal temperature control refresh mode signal INT_TCR is activated, or when the external temperature control refresh mode is set and the external temperature control refresh mode signal EXT_TCR is activated, the smart refresh circuit 330 may control the set number based on the temperature information TEMPA, TEMPS, and TEMPC. For example, at a high temperature when the third signal TEMPC is activated, the set number may be set to 8, and the smart refresh signal REF_SMT may be activated whenever the internal refresh signal REF_I is activated eight times. At room temperature, when the second signal TEMPB is activated, the set number may be set to 4, and the smart refresh signal REF_SMT may be activated whenever the internal refresh signal REF_I is activated four times. At low temperature, when the first signal TEMPA is activated, the set number may be set to 2, and the smart refresh signal REF_SMT may be activated whenever the internal refresh signal REF_I is activated twice. When both the internal temperature control refresh mode and the external temperature control refresh mode are not set, that is, when both the internal temperature control refresh mode signal INT_TCR and the external temperature control refresh mode signal EXT_TCR are deactivated, the set number may be set to a specific value regardless of the temperature information TEMPA, TEMPB, and TEMPC.

The address counter 350 may generate a counting address CNT_ADD to be used in a normal refresh operation. Since the normal refresh operation is for sequentially refreshing word lines, the address counter 350 may increase a value of the counting address CNT_ADD whenever the internal refresh signal REF_I is activated. For example, where the counting address CNT_ADD corresponds to a second word line WL2, when the internal refresh signal REF_I is activated, the value of the counting address CNT_ADD may increase to correspond to a third word line WL3.

The target address generation unit 360 may generate a target address TAR_ADD to be used in the smart refresh operation. Since the smart refresh operation is for refreshing word tines adjacent to a frequently activated word line, the target address generation unit 360 may detect the frequently activated word line that has been excessively activated several times for a specific section, and may generate the target address TAR_ADD corresponding to word lines adjacent to the frequently activated word line when the smart refresh signal REF_SMT is activated. For example, when a word line WL103 is determined to be the frequently activated word line, the target address generation unit 360 may generate the target address TAR_ADD corresponding to a word line WL102 when the smart refresh signal REF_SMT is activated and may generate the target address TAR_ADD corresponding to a word line WL104 when the smart refresh signal REF_SMT is activated again. The target address generation unit 360 may determine the frequently activated word line in response to the active command ACT and the address ADD received from the address input unit 302.

The cell array 390 may include a plurality of word lines WL0 to WLN, a plurality of bit lines BL0 to BLBM, and memory cells MC. Each of the memory cells MC may include a transistor controlled by a corresponding word line and a capacitor configured to store data input/output through a corresponding bit line.

The row circuit 370 may control a row operation of the cell array 390. The row circuit 370 may activate a word line corresponding to the address ADD received from the address input unit 302 when the active command ACT is activated. Furthermore, when the precharge command PCG is activated, the row circuit 370 may deactivate the word line activated in response to the active command ACT. And, when the internal refresh signal REF_I is activated, the row circuit 370 may control the memory cells coupled to the word line corresponding to the counting address CNT_ADD to be refreshed. Finally, when the smart refresh signal REF_SMT is activated, the row circuit 370 may control the memory cells coupled to the word lines corresponding to the target address TAR_ADD to be refreshed.

The column circuit 380 may control a column operation of the cell array 380. When the read command RD is activated, the column circuit 380 may read data DATA from bit lines corresponding to the address ADD received from the address input unit 302, and output the read data to the data input/output unit 303. Furthermore, when the write command WT is activated, the column circuit 380 may transfer data DATA, received from the data input/output unit 303, to bit lines corresponding to the address ADD received from the address input unit 302 so that the data DATA is written.

Figure 4:
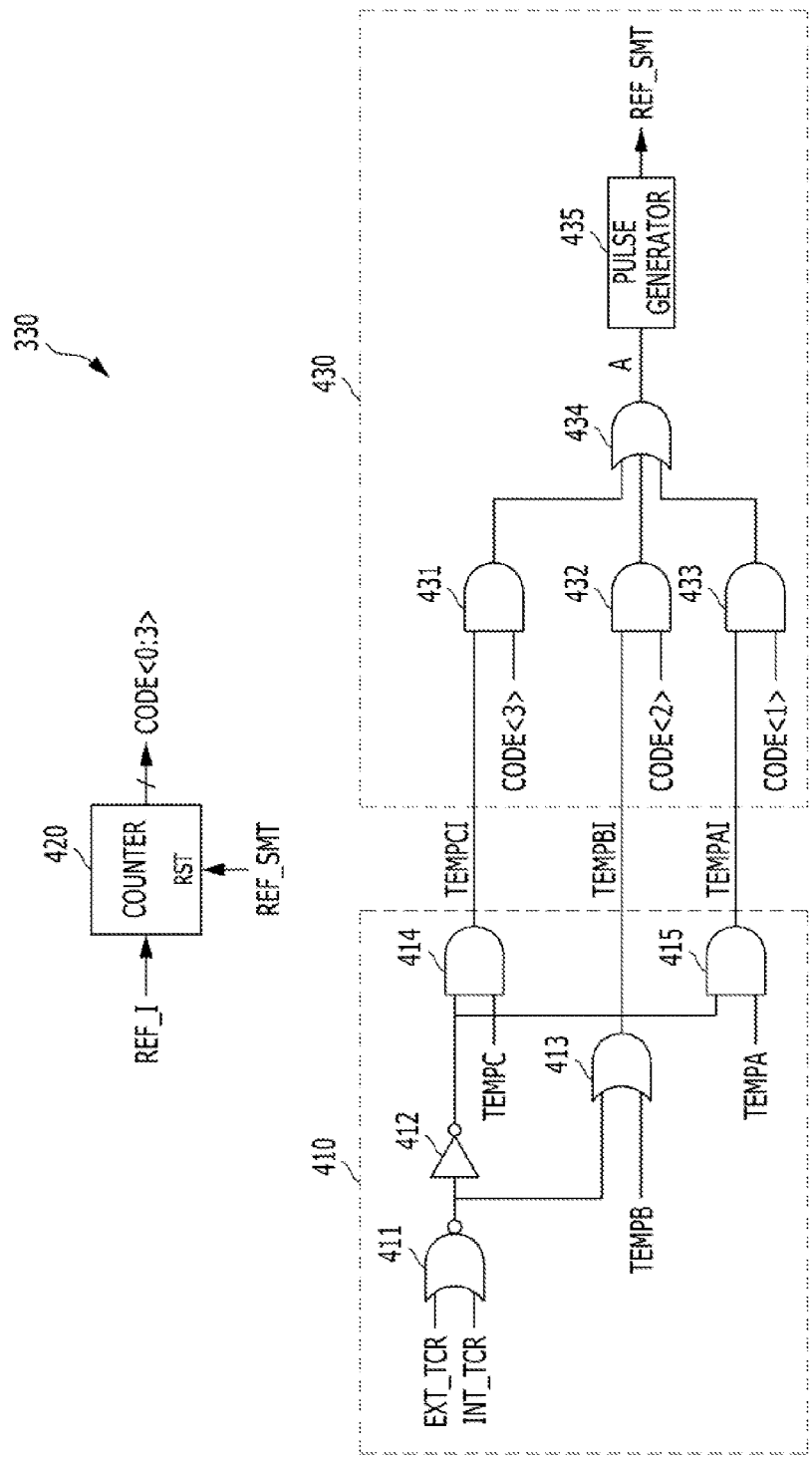
FIG. 4 illustrates a circuit block diagram of a smart refresh circuit of FIG. 3.

FIG. 4 illustrates a circuit block diagram of the smart refresh circuit 330 of FIG. 3.

Referring to FIG. 4, the smart refresh circuit 330 may include a temperature information transmission unit 410, a counter 420, and an activation unit 430.

When the internal temperature control refresh mode is set or the external temperature control refresh mode is set, the temperature information transmission unit 410 may transfer the temperature information TEMPA, TEMPB, and TEMPC to the activation unit 430 without any change. Furthermore, when both the internal temperature control refresh mode and the external temperature control refresh mode are not set, the temperature information transmission unit 410 may block the temperature information TEMPA, TEMPB, and TEMPC to the activation unit 430 from being transferred, and may transfer temperature information TEMPAI, TEMPBI, and TEMPCI, which is fixed to a preset value, to the activation unit 430. That is, when the normal refresh operation is controlled in response to the temperature information TEMPA, TEMPB, and TEMPC, the temperature information transmission unit 410 transfers the temperature information TEMPA, TEMPB, and TEMPC to the activation unit 430 without any change so that the set number is controlled in response to the temperature information TEMPA, TEMPB, and TEMPC. When the normal refresh operation is controlled regardless of the temperature information TEMPA, TEMPB, and TEMPC, the temperature information transmission unit 410 may transfer the fixed temperature information TEMPAI, TEMPBI, and TEMPCI (so that the set number is controlled regardless of the temperature information TEMPA, TEMPB, and TEMPC) to the activation unit 430.

The temperature information transmission unit 410 may include a NOR gate 411, an inverter 412, an OR gate 413, and AND gates 414 and 415. When the internal temperature control refresh signal INT_TCR or the external temperature control refresh signal EXT_TCR is activated, the temperature information transmission unit 410 may output the temperature information TEMPA, TEMPB, and TEMPC as the temperature information TEMPAI, TEMPBI, and TEMPCI, respectively. When the internal temperature control refresh signal INT_TCR and the external temperature control refresh signal EXT_TCR are deactivated, the temperature information transmission unit 410 may output the temperature information TEMPAI, TEMPBI, and TEMPCI at fixed levels of (L, H, L) regardless of the temperature information TEMPA, TEMPB, and TEMPC.

The counter 420 may count the activation number of the internal refresh signals REF_I and generate binary code CODE<0:3>. The binary code CODE<1:3> may be reset to an initial value (0, 0, 0, 0) when the smart refresh signal REF_SMT is activated.

The activation unit 430 may generate the smart refresh signal REF_SMT based on the temperature information TEMPAI, TEMPBI, and TEMPCI and the binary code CODE<0:3>. The activation unit 430 may activate the smart refresh signal REF_SMT when the value of the binary code CODE<0:3> is identical to a value corresponding to the temperature information TEMPAI, TEMPBI, and TEMPCI. For example, when the value of the binary code CODE<0:3> is 8 and a sixth signal TEMPCI is activated, the activation unit 430 may activate the smart refresh signal REF_SMT. When the value of the binary code CODE<0:3> is 4 and a fifth signal TEMPBI is activated, the activation unit 430 may activate the smart refresh signal REF_SMT. When the value of the binary code CODE<0:3> is 2 and a fourth signal TEMPAI is activated, the activation unit 430 may activate the smart refresh signal REF_SMT.

The activation unit 430 may include AND gates 431 to 433, an OR gate 434, and a pulse generator 435. When the sixth signal TEMPCI is activated and the binary code CODE<3> is activated, an intermediate signal A may be activated. When the fifth signal TEMPBI is activated and the binary code CODE<2> is activated, the intermediate signal A may be activated. When the fourth signal TEMPAI is activated and the binary code CODE<1> is activated, the intermediate signal A may be activated. Furthermore, when the intermediate signal A is activated, the smart refresh signal REF_SMT, that is, a pulse signal, may be activated.

Figure 5A:
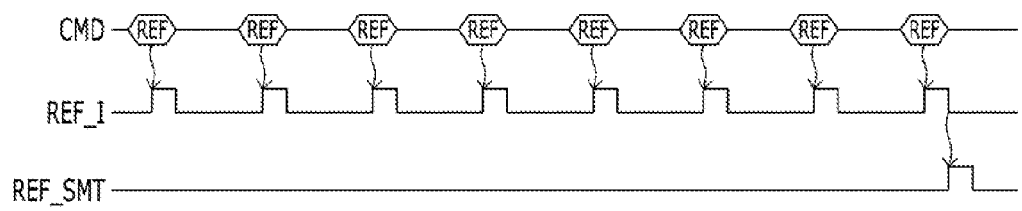
FIGS. 5A to 5C are waveform diagrams illustrating operations of the memory system of FIG. 2 in an internal temperature control refresh mode.
Figure 5B:
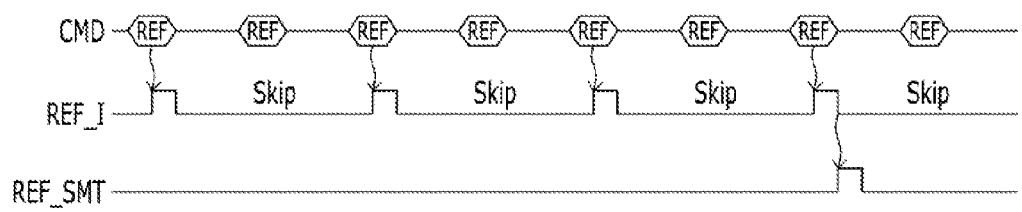
Figure 5C:
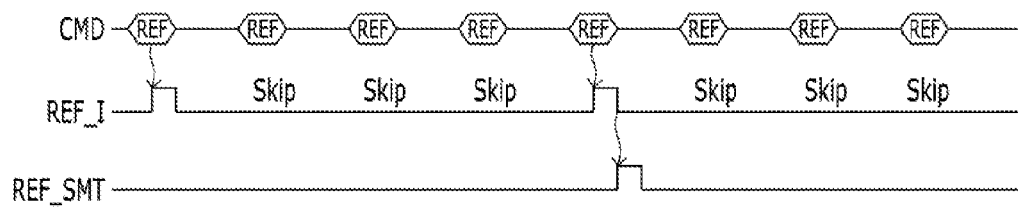

FIGS. 5A to 5C are waveform diagrams illustrating operations of the memory system of FIG. 2 in the internal temperature control refresh mode. FIG. 5A illustrates an operation at s high temperature, FIG. 5B illustrates an operation at room temperature, and FIG. 5C illustrates an operation at a low temperature.

Referring to FIG. 5A, at high temperature, whenever the refresh command REF is applied from the memory controller 210 to the memory device 220, the normal refresh circuit 320 may activate the internal refresh signal REF_I. That is, the normal refresh circuit 320 receives the refresh command REF whenever the refresh command REF is applied. When the internal refresh signal REF_I is activated eight times, the smart refresh circuit 330 may activate the smart refresh signal REF_SMT.

Referring to FIG. 5B, at room temperature, while the refresh command REF is applied eight times from the memory controller 210 to the memory device 220, the normal refresh circuit 320 may activate the internal refresh signal REF_I four times. That is, the normal refresh circuit 320 may receive half of the refresh commands REF. FIG. 5B illustrates that the refresh command REF right over "Skip" has been neglected. When the internal refresh signal REF_I is activated four times, the smart refresh circuit 330 may activate the smart refresh signal REF_SMT.

Referring to FIG. 5C, at low temperature, while the refresh command REF is applied eight times from the memory controller 210 to the memory device 220, the normal refresh circuit 320 may activate the internal refresh signal REF_I twice. That is, the normal refresh circuit 320 may receive ¼ of the refresh commands REF. FIG. 5C illustrates that the refresh command REF right over "Skip" has been neglected. When the internal refresh signal REF_I is activated twice, the smart refresh circuit 330 may activate the smart refresh signal REF_SMT.

From FIGS. 5A to 5C, it may be seen that the number of normal refresh operations that have been executed changes depending on temperature, but the number of smart refresh operations that have been executed is constant regardless of temperature.

Figure 6A:
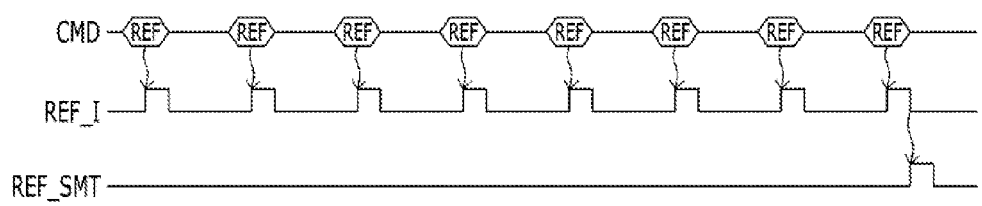
FIGS. 6A to 6C are waveform diagrams illustrating operations of the memory system of FIG. 2 in an external temperature control refresh mode.
Figure 6B:
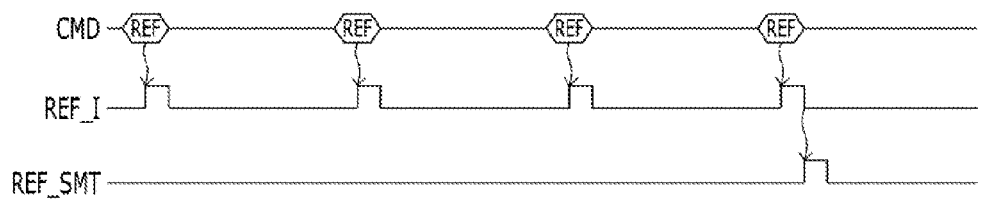
Figure 6C:
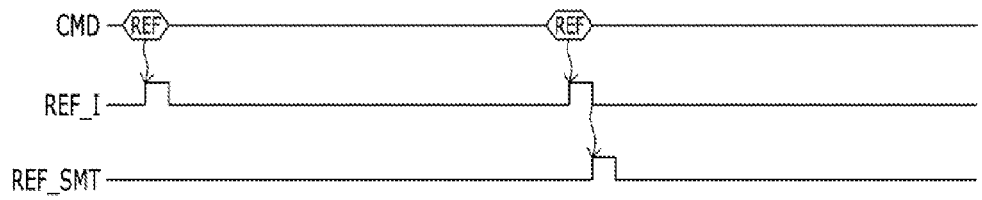

FIGS. 6A to 6C are waveform diagrams illustrating operations of the memory system of FIG. 2 in the external temperature control refresh mode. FIG. 6A illustrates an operation at high temperature, FIG. 6B illustrates an operation at room temperature, and FIG. 6C illustrates an operation at low temperature.

Referring to FIG. 6A, at high temperature, the refresh command REF is frequently applied from the memory controller 210 to the memory device 220. Furthermore, whenever the refresh command REF is applied, the normal refresh circuit 320 may activate the internal refresh signal REF_I. When the internal refresh signal REF_I is activated eight times, the smart refresh circuit 330 may activate the smart refresh signal REF_SMT.

Referring to FIG. 6B, at room temperature, the refresh command REF is applied from the memory controller 210 to the memory device 220 by only half of the input number of the refresh commands REF at high temperature as shown in FIG. 6A. Furthermore, whenever the refresh command REF is applied, the normal refresh circuit 320 may activate the internal refresh signal REF_I. When the internal refresh signal REF_I is activated four times, the smart refresh circuit 330 may activate the smart refresh signal REF_SMT.

Referring to FIG. 6C, at low temperature, the refresh command REF is applied from the memory controller 210 to the memory device 220 by only half of the input number of the refresh commands REF at room temperature. Furthermore, whenever the refresh command REF is applied, the normal refresh circuit 320 may activate the internal refresh signal REF_I. In contrast, when the internal refresh signal REF_I is activated twice, the smart refresh circuit 330 may activate the smart refresh signal REF_SMT.

From FIGS. 6A to 6C, it may be seen that the frequency of the refresh command REF applied from the memory controller 210 to the memory device 220 is changed depending on temperature and the normal refresh circuit 320 receives the refresh command REF whenever the refresh command is applied. It may also be seen that the number of normal refresh operations that have been executed is changed depending on temperature, but the number of smart refresh operations that have been executed is constant regardless of temperature.

In accordance with embodiments of the present invention, the period in which the normal refresh operation and the smart refresh operation are executed may be optimally controlled.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a temperature sensor suitable for generating temperature information; and
   a smart refresh circuit suitable for activating a smart refresh signal when an internal refresh signal is activated a set number of times, and controlling the set number based on the temperature information
   wherein the smart refresh circuit increases the set number when the temperature information indicates a higher temperature, and decreases the set number when the temperature information indicates a lower temperature.

2. The memory device of claim 1, wherein the smart refresh signal comprises a signal that enables a smart refresh operation for refreshing memory cells coupled to word lines adjacent to a frequently activated word line.

3. The memory device of claim 1, wherein the smart refresh circuit controls the set number based on the temperature information when an activation of the internal refresh signal is controlled based on the temperature information, and controls the set number regardless of the temperature information when the activation of the internal refresh signal is controlled regardless of the temperature information.

4. The memory device of claim 1, wherein the smart refresh circuit comprises:
   a counter suitable for counting the activation number of the internal refresh signals; and
   an activation unit suitable for activating the smart refresh signal based on a counting result of the counter and the temperature information.

5. The memory device of claim 4, wherein the activation unit activates the smart refresh signal when the counting result is identical to a value corresponding to the temperature information.

6. The memory device of claim 4, wherein the smart refresh circuit further comprises:
   a temperature information transmission unit suitable for transferring the temperature information generated by the temperature sensor to the activation unit without changing when an activation of the internal refresh signal is controlled based on the temperature information, and transferring temperature information that has a fixed value to the activation unit when the activation of the internal refresh signal is controlled regardless of the temperature information.

7. The memory device of claim 4, wherein the counter is reset when the smart refresh signal is activated.

8. A memory device comprising:
   a temperature sensor suitable for generating temperature information;
   a normal refresh circuit suitable for generating an internal refresh signal in response to a refresh command while selectively receiving the refresh command at a specific ratio based on the temperature information when an internal temperature control refresh mode is set; and
   a smart refresh circuit suitable for activating a smart refresh signal when the internal refresh signal is activated a set number of times, and controlling the set number based on the temperature information when any of the internal temperature control refresh mode and an external temperature control refresh mode are set,
   wherein the smart refresh circuit increases the set number when the temperature information indicates a higher temperature, and decreases the set number when the temperature information indicates a lower temperature.

9. The memory device of claim 8, wherein the normal refresh circuit increases the specific ratio when the temperature information indicates a higher temperature and decreases the specific ratio when the temperature information indicates a lower temperature.

10. The memory device of claim 8, wherein the smart refresh signal comprises a signal that enables a smart refresh operation for refreshing memory cells coupled to word lines adjacent to a frequently activated word line.

11. The memory device of claim 8, wherein the smart refresh circuit comprises:
    a temperature information transmission unit suitable for transferring the temperature information generated by the temperature sensor without changing when any of the internal temperature control refresh mode and the external temperature control refresh mode are set, and transferring temperature information which has a fixed value when both the internal temperature control refresh mode and the external temperature control refresh mode are not set;
    a counter suitable for counting the activation number of the internal refresh signals; and
    an activation unit suitable for activating the smart refresh signal based on a counting result of the counter and the temperature information transferred by the temperature information transmission unit.

12. The memory device of claim 11, wherein the activation unit activates the smart refresh signal when the counting result is identical to a value corresponding to the temperature information.

13. The memory device of claim 11, wherein the counter is reset when the smart refresh signal is activated.

14. A memory system comprising:
    a memory controller suitable for applying a refresh command to a memory device; and
    the memory device includes:
    a temperature sensor suitable for generating temperature information;
    a normal refresh circuit suitable for activating an internal refresh signal for executing a normal refresh operation when the refresh command is applied, while selectively receiving the refresh command at a specific ratio based on the temperature information; and
    a smart refresh circuit suitable for activating a smart refresh signal for executing a smart refresh operation when the internal refresh signal is applied a set number of times,
    wherein the smart refresh circuit activates the smart refresh signal when the internal refresh signal is activated the set number of times, and the smart refresh circuit increases the set number when the temperature information indicates a higher temperature, and decreases the set number when the temperature information indicates a lower temperature.

15. A memory system comprising:
    a memory device suitable for providing temperature information; and
    a memory controller suitable for controlling a period in which a refresh command is applied to the memory device in response to the temperature information,
    wherein the memory device comprises:
    a temperature sensor suitable for generating the temperature information;
    a transmission unit suitable for transferring the temperature information to the memory controller;

a normal refresh circuit suitable for activating an internal refresh signal for executing a normal refresh operation when the refresh command is applied; and a smart refresh circuit suitable for activating a smart refresh signal for executing a smart refresh operation when the internal refresh signal is applied a set number of times, and controlling the set number based on the temperature information, wherein the smart refresh circuit increases the set number when the temperature information indicates a higher temperature, and decreases the set number when the temperature information indicates a lower temperature.

* * * * *